(12) United States Patent
Sewell et al.

(10) Patent No.: US 11,424,373 B2
(45) Date of Patent: Aug. 23, 2022

(54) THERMOCOMPRESSION BONDING APPROACHES FOR FOIL-BASED METALLIZATION OF NON-METAL SURFACES OF SOLAR CELLS

(71) Applicant: SUNPOWER CORPORATION, San Jose, CA (US)

(72) Inventors: Richard Hamilton Sewell, Los Altos, CA (US); Gabriel Harley, Mountain View, CA (US); Nils-Peter Harder, San Jose, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 164 days.

(21) Appl. No.: 15/089,401

(22) Filed: Apr. 1, 2016

(65) Prior Publication Data
US 2017/0288072 A1    Oct. 5, 2017

(51) Int. Cl.
*H01L 31/0224*  (2006.01)
*H01L 31/0745*  (2012.01)
(Continued)

(52) U.S. Cl.
CPC ........... *H01L 31/022441* (2013.01); *H01L 31/02168* (2013.01); *H01L 31/02366* (2013.01); *H01L 31/0745* (2013.01); *Y02E 10/50* (2013.01)

(58) Field of Classification Search
CPC ..... H01L 31/022425; H01L 31/022441; H01L 31/022458; H01L 31/0516; H01L 31/0745;
(Continued)

(56) References Cited

U.S. PATENT DOCUMENTS 3,993,533 A    11/1976  Milnes et al.
4,058,418 A    11/1977  Lindmayer
(Continued)

FOREIGN PATENT DOCUMENTS

CN    102132423    7/2011
DE    10020412     11/2001
(Continued)

OTHER PUBLICATIONS

International Search Report and Written Opinion from PCT/US2017/024625 dated Jun. 29, 2017, 11 pgs.
(Continued)

*Primary Examiner* — Lindsey A Bernier
(74) *Attorney, Agent, or Firm* — Schwabe, Williamson & Wyatt, P.C.

(57) ABSTRACT

Thermocompression bonding approaches for foil-based metallization of non-metal surfaces of solar cells, and the resulting solar cells, are described. For example, a solar cell includes a substrate and a plurality of alternating N-type and P-type semiconductor regions disposed in or above the substrate. A plurality of conductive contact structures is electrically connected to the plurality of alternating N-type and P-type semiconductor regions. Each conductive contact structure includes a metal foil portion disposed in direct contact with a corresponding one of the alternating N-type and P-type semiconductor regions.

14 Claims, 7 Drawing Sheets

(51) Int. Cl.
*H01L 31/0236* (2006.01)
*H01L 31/0216* (2014.01)

(58) Field of Classification Search
CPC ......... H01L 31/02168; H01L 31/02366; Y02E 10/50
See application file for complete search history.

(56) References Cited

U.S. PATENT DOCUMENTS

| | | | |
|---|---|---|---|
| 4,318,938 A | 3/1982 | Barnett et al. | |
| 4,393,576 A * | 7/1983 | Dahlberg | H01L 21/283 136/244 |
| 4,400,577 A | 8/1983 | Spear | |
| 4,433,200 A | 2/1984 | Jester et al. | |
| 4,461,922 A | 7/1984 | Gay et al. | |
| 4,482,780 A | 11/1984 | Mitchell | |
| 4,581,103 A | 4/1986 | Levine et al. | |
| 4,582,588 A | 4/1986 | Jensen et al. | |
| 4,617,421 A | 10/1986 | Nath et al. | |
| 4,691,076 A | 9/1987 | Levine et al. | |
| 4,695,674 A | 9/1987 | Bar-on | |
| 4,697,041 A | 9/1987 | Okaniwa et al. | |
| 4,882,298 A | 11/1989 | Moeller et al. | |
| 4,917,752 A | 4/1990 | Jensen et al. | |
| 4,957,601 A | 9/1990 | Levine et al. | |
| 5,091,319 A | 2/1992 | Hotchkiss et al. | |
| 5,380,371 A | 1/1995 | Murakami | |
| 5,951,786 A | 9/1999 | Gee et al. | |
| 5,980,679 A | 11/1999 | Severin et al. | |
| 6,159,832 A | 12/2000 | Mayer | |
| 6,288,326 B1 | 9/2001 | Hayashi et al. | |
| 6,448,155 B1 | 9/2002 | Iwasaki et al. | |
| 6,635,307 B2 | 10/2003 | Huang et al. | |
| 7,355,114 B2 | 4/2008 | Ojima et al. | |
| 8,003,530 B2 | 8/2011 | Grohe et al. | |
| 8,146,643 B2 | 4/2012 | Kasahara et al. | |
| 8,766,090 B2 | 7/2014 | Sewell et al. | |
| 8,809,192 B2 | 8/2014 | Bertram et al. | |
| 9,040,409 B2 | 5/2015 | Kumar et al. | |
| 2005/0253142 A1 | 11/2005 | Negami et al. | |
| 2006/0166023 A1 | 7/2006 | Yoshikata et al. | |
| 2006/0213548 A1 | 9/2006 | Bachrach et al. | |
| 2008/0042153 A1 | 2/2008 | Beeson et al. | |
| 2008/0128019 A1 | 6/2008 | Lopatin et al. | |
| 2008/0216887 A1 | 9/2008 | Hacke et al. | |
| 2008/0223429 A1 | 9/2008 | Everett et al. | |
| 2009/0194162 A1 | 8/2009 | Sivaram et al. | |
| 2009/0266399 A1 * | 10/2009 | Basol | H01L 31/0322 136/244 |
| 2010/0032013 A1 | 2/2010 | Krause et al. | |
| 2010/0200058 A1 | 8/2010 | Funakoshi | |
| 2010/0243041 A1 | 9/2010 | Carlson et al. | |
| 2012/0012180 A1 * | 1/2012 | Abiko | H01L 31/048 136/256 |
| 2012/0097245 A1 | 4/2012 | Nishina et al. | |
| 2012/0103408 A1 | 5/2012 | Moslehi et al. | |
| 2012/0204938 A1 | 8/2012 | Hacke et al. | |
| 2012/0240995 A1 * | 9/2012 | Coakley | H01L 31/0201 136/256 |
| 2013/0160825 A1 | 6/2013 | Lantzer et al. | |
| 2013/0183796 A1 | 7/2013 | Stewart et al. | |
| 2014/0034128 A1 | 2/2014 | Rim et al. | |
| 2014/0083489 A1 * | 3/2014 | Lai | H01L 31/02363 136/251 |
| 2014/0174518 A1 * | 6/2014 | Wu | H01L 31/022425 136/256 |
| 2014/0174519 A1 * | 6/2014 | Rim | H01L 31/02002 136/256 |
| 2014/0179056 A1 * | 6/2014 | Morse | H01L 31/022441 438/97 |
| 2015/0090329 A1 | 4/2015 | Pass | |
| 2015/0318420 A1 | 11/2015 | Sewell et al. | |
| 2016/0079450 A1 | 3/2016 | Harley et al. | |
| 2016/0087119 A1 * | 3/2016 | Pass | H01L 31/18 438/98 |

FOREIGN PATENT DOCUMENTS

| | | |
|---|---|---|
| EP | 1634673 | 3/2006 |
| JP | 2003/246971 | 9/2003 |
| JP | 2009/130116 | 6/2009 |
| JP | 2011/054831 | 3/2011 |
| WO | WO 1999/040760 | 8/1999 |
| WO | WO 2010/025269 | 3/2010 |
| WO | WO 2014098988 | 6/2014 |

OTHER PUBLICATIONS

International Preliminary Report on Patentability from PCT/US2017/024625 dated Oct. 11, 2018, 10 pgs.

Cotter, et al., "Novel Process for Simplified Buried Contact Solar Cells," Institute of Electrical and Electronics Engineers, Aug. 2000, pp. 303-306.

Non-final Notice of Reasons for Rejection from Japanese Patent Application No. 2018-182848 dated Oct. 16, 2019, 7 pgs.

* cited by examiner

THERMOCOMPRESSION BONDING APPROACHES FOR FOIL-BASED METALLIZATION OF NON-METAL SURFACES OF SOLAR CELLS

TECHNICAL FIELD

Embodiments of the present disclosure are in the field of renewable energy and, in particular, include approaches for foil-based metallization of non-metal surfaces of solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
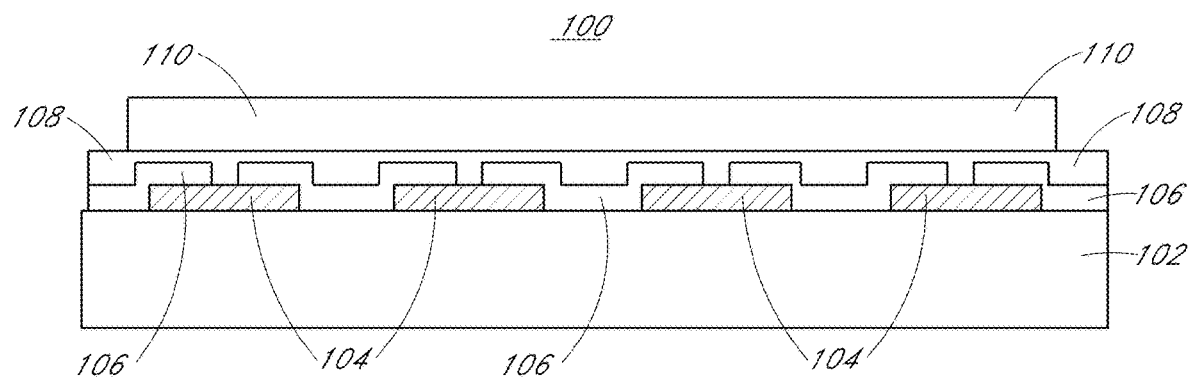
FIG. 1 illustrates a cross-sectional view of a solar cell including a metal seed layer.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Thermocompression bonding approaches for foil-based metallization of non-metal surfaces of solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a substrate and a plurality of alternating N-type and P-type semiconductor regions disposed in or above the substrate. A plurality of conductive contact structures is electrically connected to the plurality of alternating N-type and P-type semiconductor regions. Each conductive contact structure includes a metal foil portion disposed in direct contact with a corresponding one of the alternating N-type and P-type semiconductor regions.

In another embodiment, a solar cell includes a substrate and a plurality of alternating N-type and P-type semiconductor regions disposed in or above the substrate. A plurality of conductive contact structures is electrically connected to the plurality of alternating N-type and P-type semiconductor regions. Each conductive contact structure includes a metal foil portion disposed above and in alignment with a corresponding one of the alternating N-type and P-type semiconductor regions. The metal foil portion has a texturized surface proximate to the corresponding one of the alternating N-type and P-type semiconductor regions.

Also disclosed herein are methods of fabricating solar cells. In one embodiment, a method of fabricating a solar cell includes texturizing a surface of a metal foil. The method also includes locating the texturized surface of the metal foil over a non-metalized surface of a wafer of the solar cell. The method also includes, subsequent to the locating, electrically connecting the metal foil with the non-metalized surface of the wafer by thermocompression bonding.

One or more embodiments described herein provides a technique for thermocompression bonding of a metal foil (such as an aluminum foil) to a solar cell. In an embodiment, bonding of an aluminum foil is performed directly to polycrystalline silicon regions of the solar cell and a bottom anti-reflective coating (BARC) layer exposing portions of the polycrystalline silicon regions. The resulting structure may be described as a seed-free thermocompression bonded solar cell, where a seed layer is an otherwise intervening metal layer. Specific embodiments described herein involve themocompression bonding of an aluminum foil to non-metal surfaces together with foil texturing for implemented for improved thermocompression bonding.

To provide context, process approaches described herein may be motivated by a need for cost and operation reduction in a cell metallization process. Earlier attempts at reducing cost associated with use of an intervening metal seed layer included the use of a printed seed layer, which was limited by compatibility with plating and series resistance. On the other hand, thermocompression bonding of an aluminum foil has previously also required the use of a sputtered metal "seed" layer that is deposited on the cell to enable bonding of the metal foil to semiconductor and insulating materials. By contrast, embodiments described herein do not involve use of a plating process or use of an intervening metal seed layer.

Addressing one or more of the above issues, in accordance with an embodiment of the present disclosure, electrical contact is made directly from a metal foil to a silicon wafer through the contact openings without the need for a metal seed layer. The aluminum foil can be sufficiently adhered to a BARC layer enabling direct contact between the metal foil and exposed semiconductor regions on or in the substrate. Particular embodiments that may be implemented to enhance such direct bonding may include one or more of use of a roller tool for boding, foil cleaning before bonding, higher temperature and pressure for bonding, etc. Regardless, in at least some of the embodiments described below, use of an intervening metal seed layer is omitted.

To exemplify the concepts at hand, FIG. 1 illustrates a cross-sectional view of a solar cell including a metal seed layer. Referring to FIG. 1, a solar cell 100 includes a substrate 102. A plurality of alternating N-type and P-type semiconductor regions 104 is disposed in or above the substrate 102. A bottom-anti-reflective coating (BARC) layer 106 is disposed over and exposes portions of the plurality of alternating N-type and P-type semiconductor regions 104. A metal seed layer 108 is disposed on the BARC layer 106 and on the exposed portions of the plurality of alternating N-type and P-type semiconductor regions 104. A metal foil 110 is disposed on the metal seed layer 108.

Figure 2:
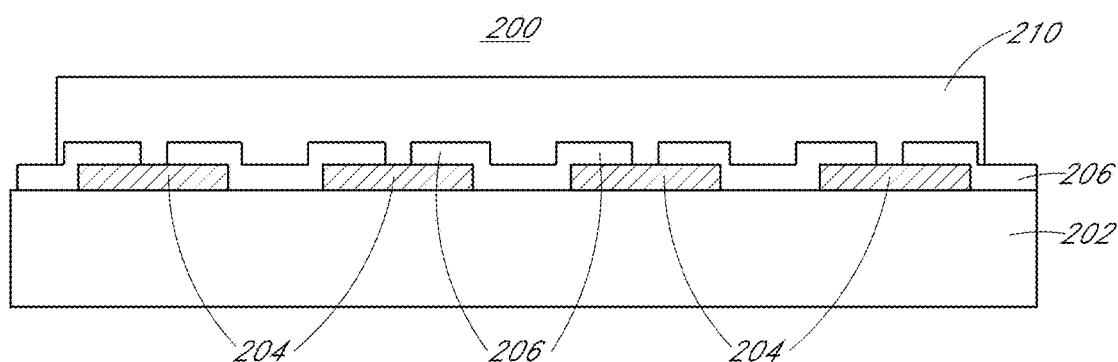
FIG. 2 illustrates a cross-sectional view of a solar cell omitting an intervening metal seed layer, in accordance with an embodiment of the present disclosure.

In contrast to FIG. 1, FIG. 2 illustrates a cross-sectional view of a solar cell omitting an intervening metal seed layer, in accordance with an embodiment of the present disclosure. Referring to FIG. 2, a solar cell 200 includes a substrate 202. A plurality of alternating N-type and P-type semiconductor regions 204 is disposed in or above the substrate 202. A bottom-anti-reflective coating (BARC) layer 206 is disposed over and exposes portions of the plurality of alternating N-type and P-type semiconductor regions 204. A metal foil 210 is disposed on the BARC layer 206 and on the exposed portions of the plurality of alternating N-type and P-type semiconductor regions 204. The metal foil 210 is in direct contact with the exposed portions of the plurality of alternating N-type and P-type semiconductor regions 204. In an embodiment, the metal foil 210 is bonded to the alternating N-type and P-type semiconductor regions 204 by thermocompression bonding. It is to be appreciated that FIG. 2 may represent a partially completed solar cell, as further processing may include patterning of the metal foil 210, exemplary embodiments of which are described in greater detail below. It is to be appreciated that reference to a BARC layer throughout may be used to more generally refer to a dielectric layer, where the dielectric layer may be anti-reflective or reflective depending on specific implementations. Nonetheless, use of the term "BARC layer" is consistent with general usage of such a dielectric layer in the art.

It is to be appreciated that openings in the BARC layer 206 that accommodate direct contact of the metal foil 210 to the plurality of alternating N-type and P-type semiconductor regions 204 may be formed prior to metallization or during metallization. For example in one embodiment, openings are formed in the BARC layer 206 prior to metallization, e.g., by patterning with laser ablation of a lithography and etch process. In another embodiment, metallization to form a direct contact of the metal foil 210 to the plurality of alternating N-type and P-type semiconductor regions 204 may be performed through the BARC layer 206, e.g., by laser or other spot welding, to effectively create openings in the BARC layer 206 that surround such spot welds.

Figure 3A:
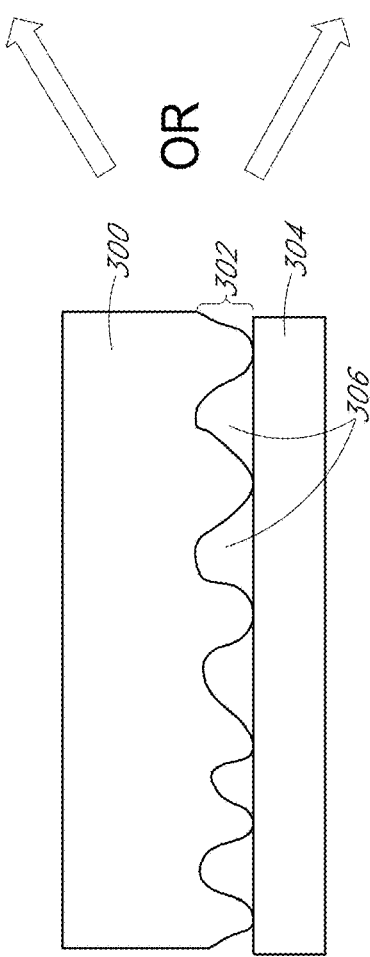
FIG. 3A illustrates a cross-sectional and magnified view of an initial interface between a texturized metal foil and a BARC layer of a solar cell, in accordance with an embodiment of the present disclosure.

In accordance with another embodiment of the present disclosure, to enable successful bonding of a metal foil directly to semiconductor regions of a solar cell, texturized foil is used or a foil texturizing operation is performed. As an example, FIG. 3A illustrates a cross-sectional and magnified view of an initial interface between a texturized metal foil and a BARC layer of a solar cell, in accordance with an embodiment of the present disclosure. Referring to FIG. 3A, a metal foil 300 has a texturized surface 302 in contact with a BARC layer 304 of a solar cell. The BARC layer may be used to partially cover an underlying semiconductor region (not shown). In one embodiment, the texturized surface 302 is described as including valleys 306.

Figure 3B:
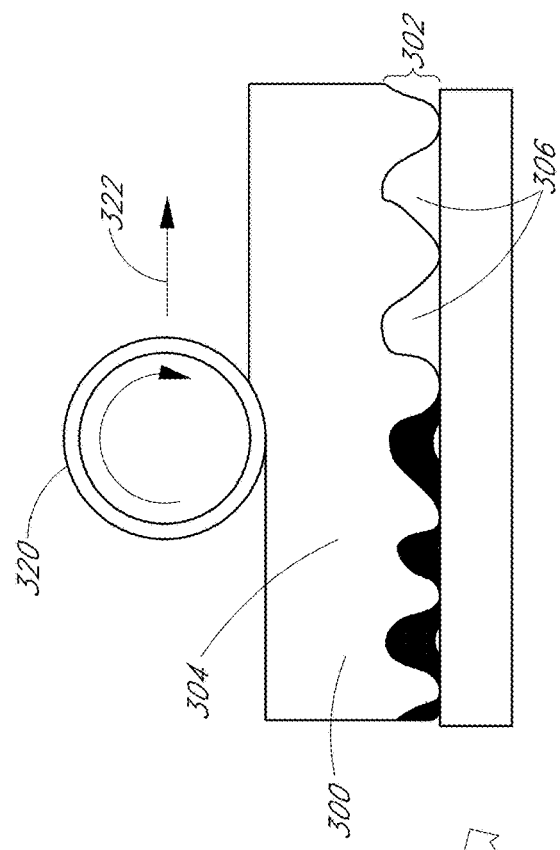
FIG. 3B illustrates a cross-sectional and magnified view of bonding interface between a texturized metal foil and a BARC layer of a solar cell where the bonding is performed using a roller, in accordance with an embodiment of the present disclosure.

Not to be bound by theory, it is understood that the valleys 306 may provide a place for metal to flow to during a bonding process. As a first example, FIG. 3B illustrates a cross-sectional and magnified view of bonding interface between a texturized metal foil and a BARC layer of a solar cell where the bonding is performed using a roller, in accordance with an embodiment of the present disclosure. Referring to FIG. 3B, a roller 320 is rolled in the direction 322 across the surface of metal foil 300. A metal flow region 324 is formed between the texturized surface 302 and the BARC layer 304. In one embodiment, the metal flow region 324 fills in and at least partially closes the valleys 306, providing a strong bond between the metal foil 300 and the BARC layer 304.

Figure 3C:
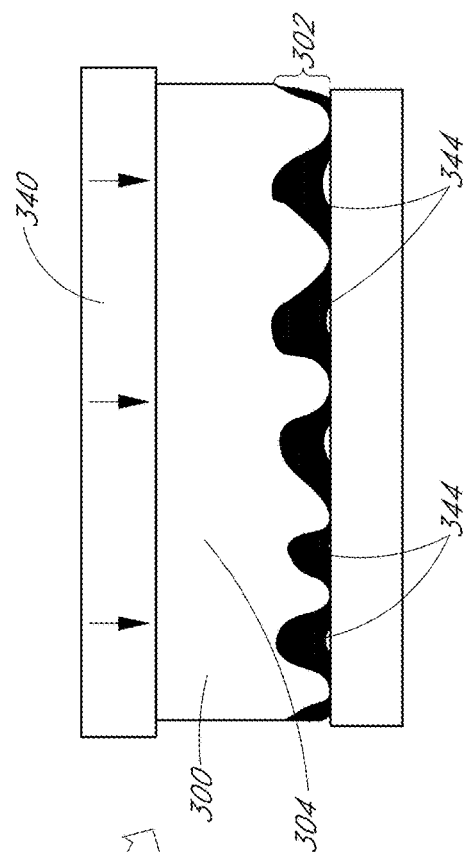
FIG. 3C illustrates a cross-sectional and magnified view of bonding interface between a texturized metal foil and a BARC layer of a solar cell where the bonding is performed using a pressure plate, in accordance with an embodiment of the present disclosure.

In a second example, FIG. 3C illustrates a cross-sectional and magnified view of bonding interface between a texturized metal foil and a BARC layer of a solar cell where the bonding is performed using a pressure plate, in accordance with an embodiment of the present disclosure. Referring to FIG. 3C, a pressure plate 340 is pressed down on the surface of metal foil 300. A metal flow region 344 is formed between the texturized surface 302 and the BARC layer 304. In one embodiment, the metal flow region 344 fills in and at least partially closes the valleys 306, providing a strong bond between the metal foil 300 and the BARC layer 304.

Figure 4:
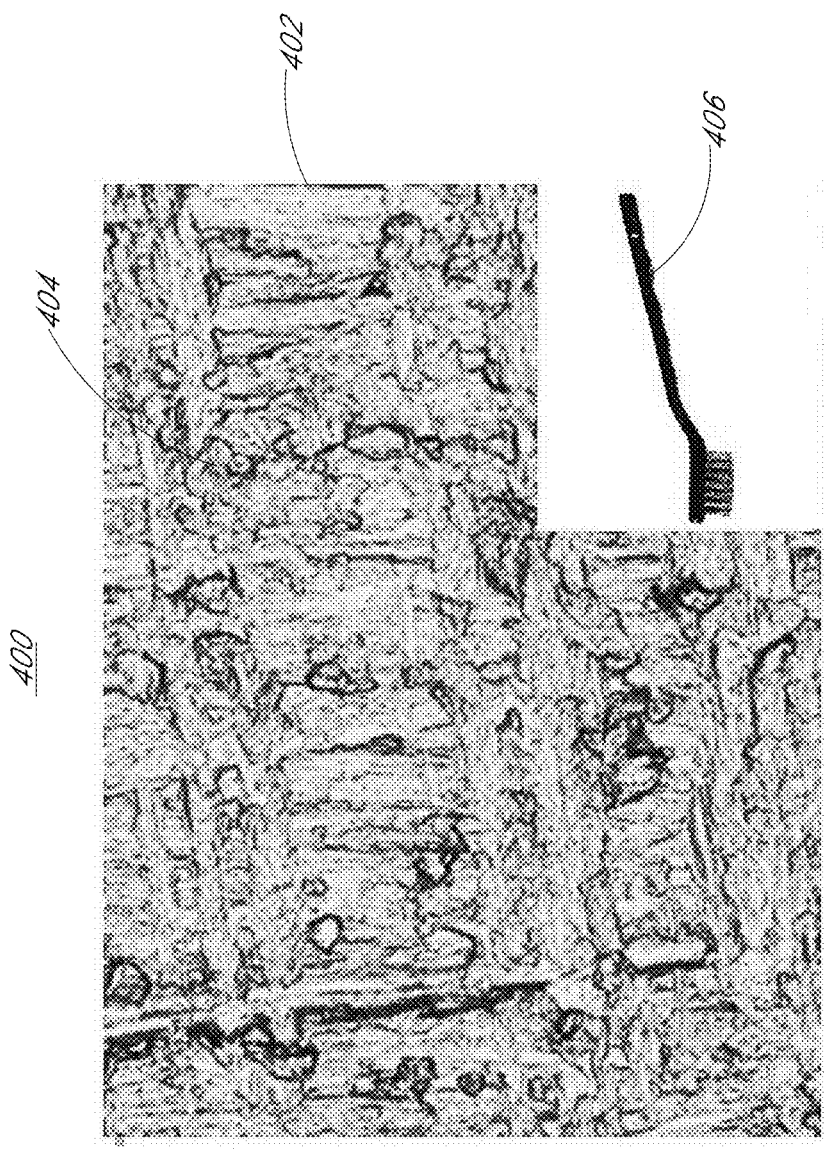
FIG. 4 is a magnified optical image of a texturized aluminum metal foil in accordance with an embodiment of the present disclosure.

FIG. 4 is a magnified optical image 400 of a texturized aluminum metal foil in accordance with an embodiment of the present disclosure. Referring to FIG. 4, a surface 402 of a metal foil has texture 404 therein. In one embodiment, the texture 404 is created by a wire brush 406, such as is depicted in the inset of the image 400. In one such embodiment, the brushed foil texture 404 is created by first cleaning and then texturizing with a wire brush in two directions. The process may provide a fresh oxide surface and higher bond pressure on raised portions of the metal foil. In other embodiments, embossing or etching is used to texturize the metal foil.

Figure 5:
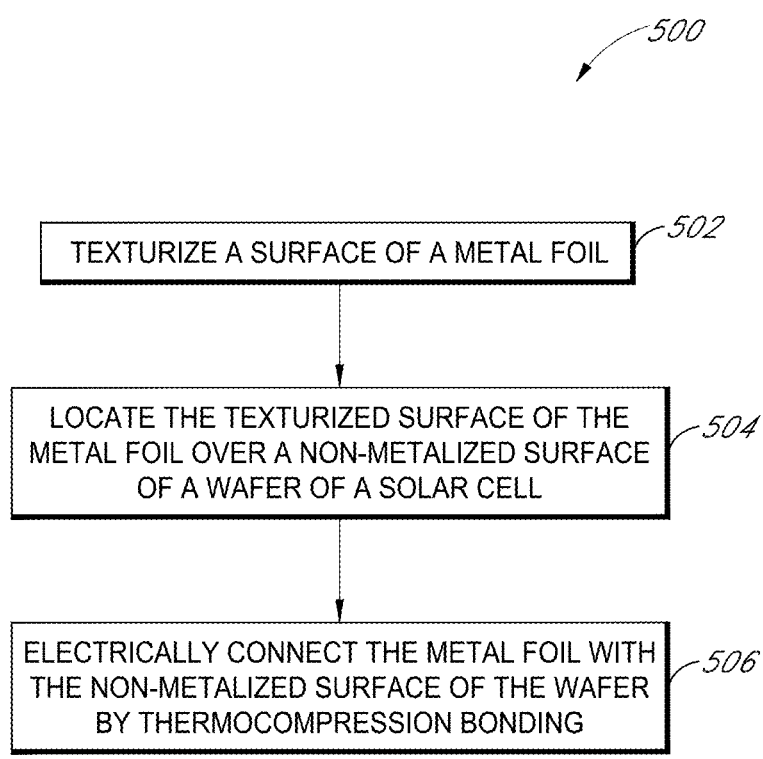
FIG. 5 is a flowchart representing various operations in a method of fabricating a solar cell, in accordance with an embodiment of the present disclosure.

As described above, inclusion of a foil texturizing process for solar cell manufacture can enable adhesion of a metal foil to a solar cell. FIG. 5 is a flowchart 500 representing various operations in a method of fabricating a solar cell, in accordance with an embodiment of the present disclosure.

Referring to operation 502 of FIG. 5, a method of fabricating a solar cell includes texturizing a surface of a metal foil, examples of which were described in association with FIGS. 3A and 4. In one embodiment, texturizing the surface of the metal foil includes using a technique selected from the group consisting of brushing, embossing and etching.

Referring to operation 504 of FIG. 5, the method also includes locating the texturized surface of metal foil over a non-metalized surface of a wafer of the solar cell, e.g., by foil and cell alignment. In one embodiment, locating the metal foil with the non-metalized surface of the wafer includes performing a tacking process. In a specific such embodiment, the tacking process involves first forming an array of point or spot welds. The array of point or spot welds may be formed by thermocompression bonding, e.g., using spikes, a spiked roller, a porcupine roller, or a bed of nails. Alternatively the locating may be performed using a laser welding process.

Not to be bound by theory, it is understood that a tacking process may involve breaking through portions of one or more metal oxide layers at an interface between a metal foil and a non-metalized surface of a solar cell to effectively form a plurality of spot welds. In an embodiment, the plurality of spot welds provides channels between the metal foil and the non-metalized surface for subsequent removal of air from between the metal foil and the non-metalized surface.

Referring to operation 506 of FIG. 5, the method also includes, subsequent to the locating, bonding the metal foil with the non-metalized surface of the wafer by thermocompression bonding, examples of which were described in association with FIGS. 3B and 3C. In an embodiment, a portion of the non-metallized surface of the solar cell is a semiconductor region exposed by a BARC layer, and the thermocompression bonding electrically connects the metal foil to the semiconductor region. In an embodiment, a relatively high bonding force is used for the thermocompression bonding, e.g., an approximately 50 kg force may be applied using an approximately on 9.5 mm diameter roller. In an embodiment, a relatively high bonding temperature is used, e.g., bonding temperature of approximately 440 degrees Celsius. In one specific embodiment, the thermocompression bonding involves applying a shear force to the metal foil, an example of which is the roller process of FIG. 3B. In another specific embodiment, the thermocompression bonding involves applying a normal force to the metal foil, an example of which is the pressure plate process of FIG. 3C.

As exemplified in FIG. 3B above, in an embodiment, a shear thermocompression process is used to bond the metal foil to the wafer of the solar cell. Other approaches for generating such a shear force may include pressing a graphite puck into the metal foil over the center of the wafer and moving it toward the outside of the wafer in a spiral motion so as to expel the air from between the foil and the wafer, while still pressing the puck downwards on the metal foil. In another approach, a set of graphite paddles or squeegees are used to bond down the metal foil. One possible sequence is to use two paddles to swipe left and right from the center to bond a center strip, followed by up and down motions from the center strip to complete the bonding. It is to be appreciated that other swipe sequences may also be suitable. In one embodiment, a vacuum fixture is implemented to evacuate the air from between the metal foil and the wafer during thermocompression bonding.

Figure 6A:
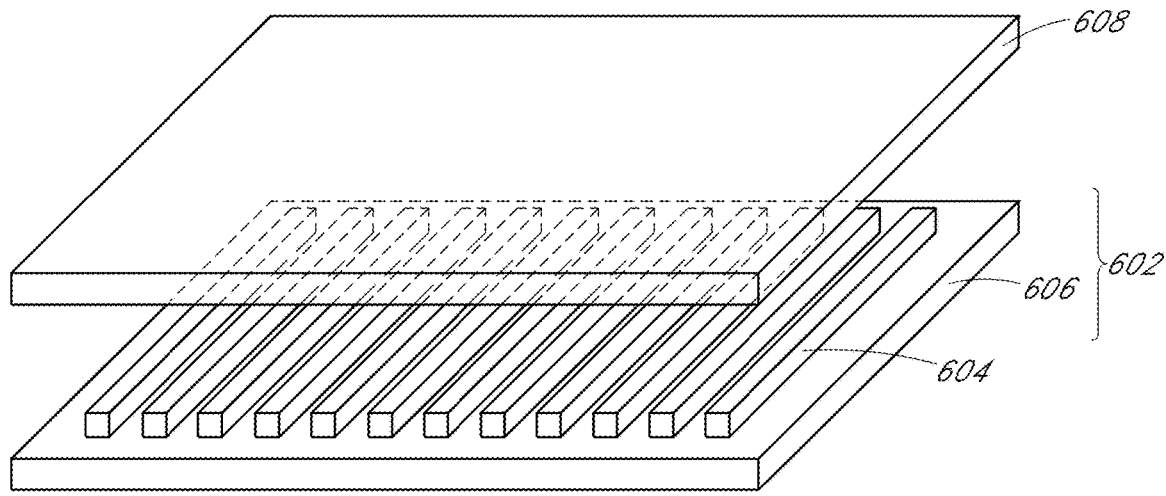
FIGS. 6A and 6B illustrate angled views of various stages in the fabrication of a solar cell using foil-based metallization, in accordance with an embodiment of the present disclosure.
Figure 6B:
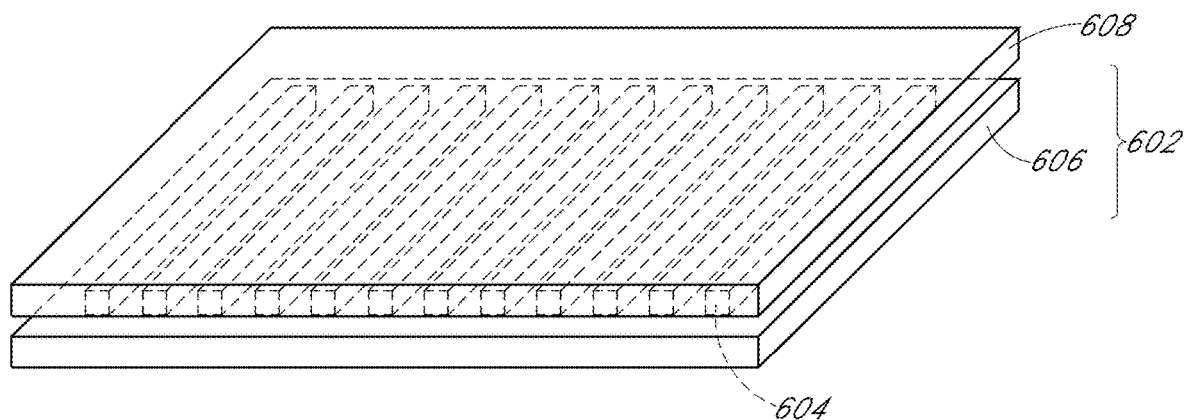

A metal foil and solar cell pairing approach involving thermocompression bonding may be implemented using a non-metallized surface of a wafer of the solar cell. As an example, FIGS. 6A and 6B illustrate angled views of various stages in the fabrication of a solar cell using foil-based metallization. Referring to FIG. 6A, a metal foil 608 is placed over a wafer 602 having a plurality of emitter regions 604 (which may include non-metallized polycrystalline silicon regions) disposed on or above a substrate 606. In FIG. 6B, the metal foil is fit-up with the substrate 606, which may include a tacking process.

Upon fitting up of the metal foil 608 and the substrate 606, the metal foil is thermocompression bonded to the plurality of emitter regions 604. In an embodiment, a shear force is applied during the thermocompression bonding. In another embodiment, a normal force is applied during the thermocompression bonding. The thermocompression bonding may electrically connect a substantial portion of the metal foil 608 with a non-metalized plurality of emitter regions 604.

In an embodiment, at the time of joining the metal foil 608 and the substrate 602, the metal foil 608 has a surface area substantially larger than a surface area of the wafer 602 of the solar cell. In one such embodiment, subsequent to electrically contacting the metal foil 608 to the non-metalized plurality of emitter regions 604, the metal foil is cut to provide the metal foil 608 having a surface area substantially the same as the surface area of the wafer 602 of the solar cell. In another embodiment, however, prior to placing the metal foil 608 over the non-metalized plurality of emitter regions 604 of the solar cell, a large sheet of foil is cut to provide the metal foil 608 having a surface area substantially the same as a surface area of the wafer 602 of the solar cell, as is depicted in FIG. 6A.

In an embodiment, the resulting structures from the process described above in association with FIGS. 6A and 6B are subjected to a contact patterning process. As an example, FIGS. 7A-7C illustrate cross-sectional views of various stages in the fabrication of a solar cell using foil-based metallization, in accordance with an embodiment of the present disclosure.

Figure 7A:
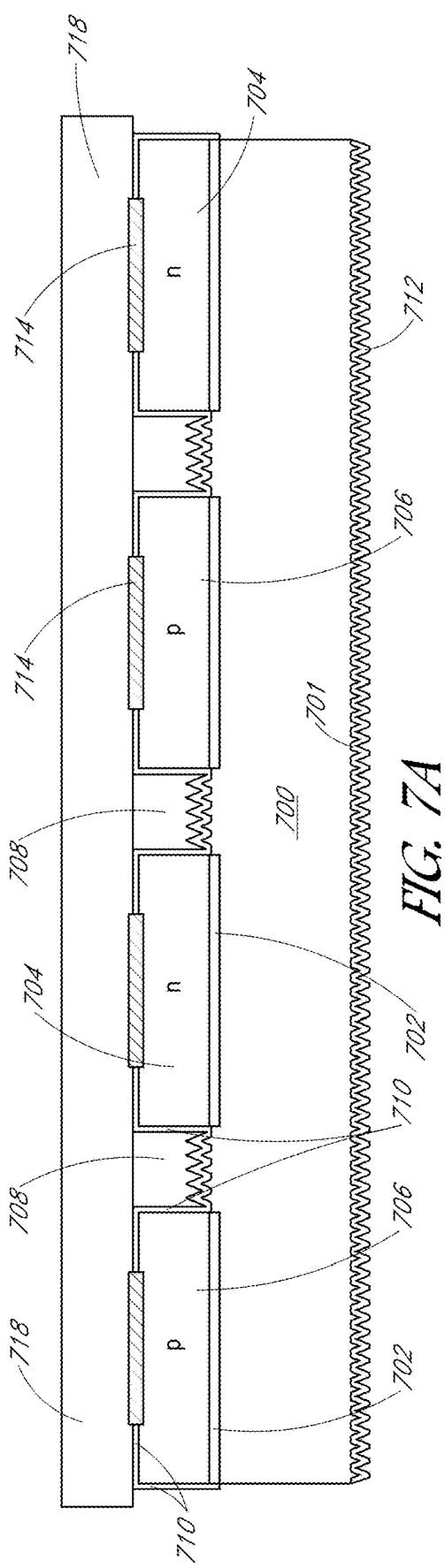
FIGS. 7A-7C illustrate cross-sectional views of various stages in the fabrication of a solar cell using foil-based metallization, in accordance with an embodiment of the present disclosure.
Figure 7B:
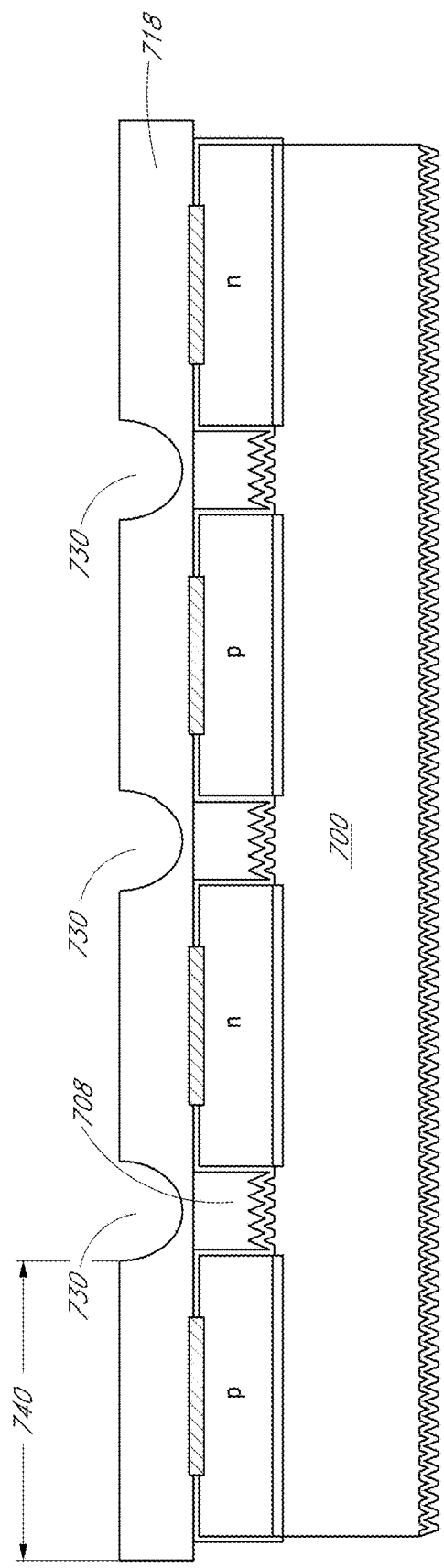
Figure 7C:
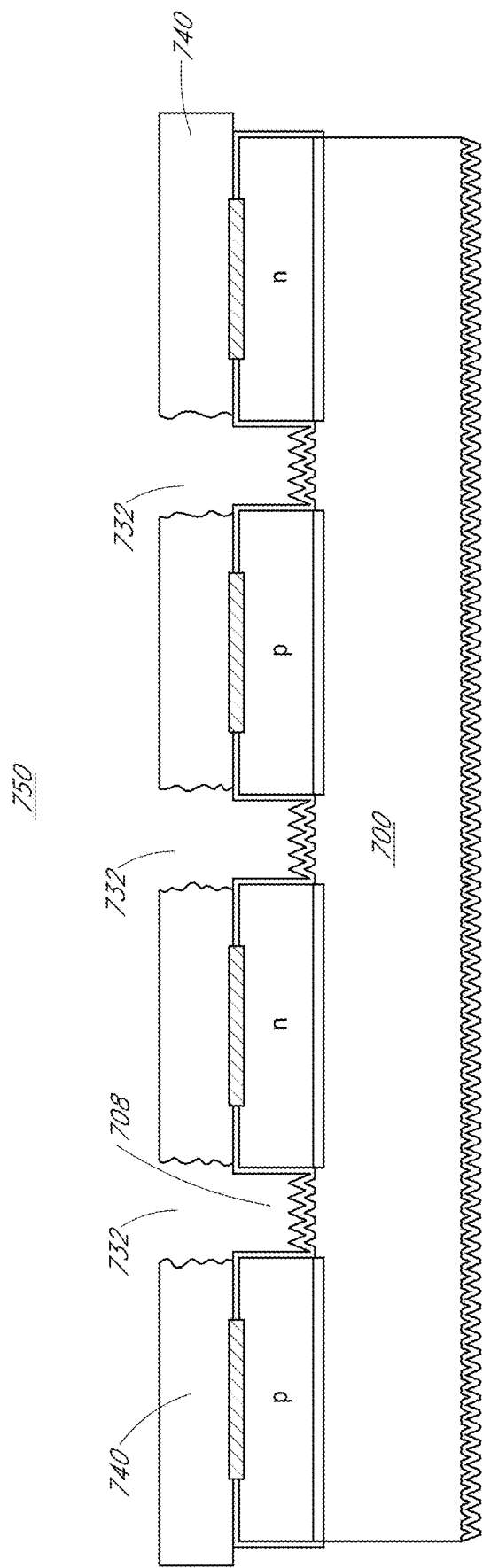

Referring to FIG. 7A, a plurality of alternating N-type and P-type semiconductor regions are disposed above a substrate. In particular, a substrate 700 has disposed there above N-type semiconductor regions 704 and P-type semiconductor regions 706 disposed on a thin dielectric material 702 as an intervening material between the N-type semiconductor regions 704 or P-type semiconductor regions 706, respectively, and the substrate 700. The substrate 700 has a light-receiving surface 701 opposite a back surface above which the N-type semiconductor regions 704 and P-type semiconductor regions 706 are formed.

In an embodiment, the substrate 700 is a monocrystalline silicon substrate, such as a bulk single crystalline N-type doped silicon substrate. It is to be appreciated, however, that substrate 700 may be a layer, such as a multi-crystalline silicon layer, disposed on a global solar cell substrate. In an embodiment, the thin dielectric layer 702 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 704 and 706, respectively, are formed from polycrystalline silicon formed by, e.g., using a plasma-enhanced chemical vapor deposition (PECVD) process. In one such embodiment, the N-type polycrystalline silicon emitter regions 704 are doped with an N-type impurity, such as phosphorus. The P-type polycrystalline silicon emitter regions 706 are doped with a P-type impurity, such as boron. As is depicted in FIG. 7A, the alternating N-type and P-type semiconductor regions 704 and 706 may have trenches 708 formed there between, the trenches 708 extending partially into the substrate 700. Additionally, in one embodiment, a bottom anti-reflective coating (BARC) material 710 or other protective layer (such as a layer amorphous silicon) is formed on the alternating N-type and P-type semiconductor regions 704 and 706, exposing only portions of the N-type and P-type semiconductor regions 704 and 706, as is depicted in FIG. 7A. In one such embodiment, the metal foil is in direct contact with, and possibly thermocompression bonded to, the BARC material layer 710. In an embodiment, BARC layer includes a silicon-rich silicon nitride layer. It is to be appreciated that reference to a BARC layer throughout may be used to more generally refer to a dielectric layer, where the dielectric layer may be anti-reflective or reflective depending on specific implementations. Nonetheless, use of the term "BARC layer" is consistent with general usage of such a dielectric layer in the art.

In an embodiment, the light receiving surface 701 is a texturized light-receiving surface, as is depicted in FIG. 7A. In one embodiment, a hydroxide-based wet etchant is employed to texturize the light receiving surface 701 of the substrate 700 and, possibly, the trench 708 surfaces as is also depicted in FIG. 7A. It is to be appreciated that the timing of the texturizing of the light receiving surface may vary. For example, the texturizing may be performed before or after the formation of the thin dielectric layer 702. In an embodiment, a texturized surface may be one which has a regular or an irregular shaped surface for scattering incoming light, decreasing the amount of light reflected off of the light receiving surface 701 of the solar cell. Referring again to FIG. 7A, additional embodiments can include formation of a passivation and/or anti-reflective coating (ARC) layers (shown collectively as layer 712) on the light-receiving surface 701. It is to be appreciated that the timing of the formation of passivation and/or ARC layers may also vary. It is also to be appreciated that while N-type and P-type semiconductor regions 704 and 706 are depicted and described as regions discrete from substrate 700, in another embodiment, semiconductor regions are fabricated using diffusion regions formed in the substrate 700.

Referring again to FIG. 7A, a metal foil 718 is adhered to the alternating N-type and P-type semiconductor regions 704 and 706 by directly coupling portions of the metal foil 718 with a corresponding portion of each of the alternating N-type and P-type semiconductor regions 704 and 706. In one such embodiment, the direct coupling of portions of the metal foil 718 with a corresponding portion of each of the alternating N-type and P-type semiconductor regions 704 and 706 involves thermocompression bonding that may involve formation of a metal flow region 714 at each of such locations, as is depicted in FIG. 7A. In relation to embodiments described herein, such a metal flow region 714 is considered part of the metal foil 718.

In an embodiment, the metal foil 718 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil.

FIG. 7B illustrates the structure of FIG. 7A following formation of laser grooves in the metal foil. Referring to FIG. 7B, the metal foil 718 is laser ablated through only a portion of the metal foil 718 at regions corresponding to locations between the alternating N-type and P-type semiconductor regions 704 and 706, e.g., above trench 708 locations as is depicted in FIG. 7B. The laser ablating forms grooves 730 that extend partially into, but not entirely through, the metal foil 718. In an embodiment, forming laser grooves 730 involves laser ablating a thickness of the metal foil 718 approximately in the range of 80-99% of an entire thickness of the metal foil 718. That is, in one embodiment, it is critical that the lower portion of the metal foil 718 is not penetrated, such that metal foil 718 protects the underlying emitter structures. In an alternative embodiment, an indentation approach may be used in place of a laser ablation approach.

The grooves 730 of FIG. 7B may then be used to isolate conductive regions 740 as metallization structures for the underlying emitter regions. For example, referring to FIG. 7C, the grooves 730 are extended to provide gaps 732 between conductive regions 740. In an embodiment, the patterned metal foil 718 is etched to isolate portions 740 of the metal foil 718. In one such embodiment, the structure of FIG. 7B is exposed to a wet etchant. Although the wet etchant etches all exposed portions of the metal foil 718, a carefully timed etch process is used to break through the bottoms of the laser grooves 730 without significantly reducing the thickness of the non-grooved regions 740 of the metal foil 718, as is depicted in FIG. 7C. In a particular embodiment, a hydroxide based etchant is used, such as, but not limited to, potassium hydroxide (KOH) or tetramethylammonium hydroxide (TMAH).

In another embodiment (not shown), the remaining metal foil 718 of FIG. 7B is subsequently anodized at exposed surfaces thereof to isolate regions 740 of the remaining metal foil 718 corresponding to the alternating N-type and P-type semiconductor regions 704 and 706. In particular, the exposed surfaces of the metal foil 718, including the surfaces of the grooves 730, are anodized to form an oxide coating. At locations corresponding to the alternating N-type and P-type semiconductor regions 704 and 706, e.g., in the grooves 730 at locations above the trenches 708, the entire remaining thickness of the metal foil 718 is anodized there through to isolate regions 740 of metal foil 718 remaining above each of the N-type and P-type semiconductor regions 704 and 706.

Referring again to FIG. 7C, a solar cell 750 includes a substrate 700 and a plurality of alternating N-type and P-type semiconductor regions 704 and 706 disposed in or above the substrate 700. A plurality of conductive contact structures 740 is electrically connected to the plurality of alternating N-type and P-type semiconductor regions 704 and 706. Each conductive contact structure includes a metal foil portion 740 disposed in direct contact with a corresponding one of the alternating N-type and P-type semiconductor regions 704 and 706.

In accordance with an embodiment of the present disclosure, the metal foil portions 740 each have a texturized surface proximate to the corresponding one of the alternating N-type and P-type semiconductor regions 704 and 706. Examples of such a texturized surface are described in association with FIGS. 3A-3C and 4. In one such embodiment, the texturized surface of the metal foil portion is in direct contact with the corresponding one of the alternating N-type and P-type semiconductor regions 704 and 706. However, although embodiments described herein are largely directed to seedless arrangements, a texturized surface for a metal foil may enhance arrangements where a seed layer is still used. Accordingly, in an alternative embodiment, although not depicted, the texturized surface of the metal foil portions 740 is disposed on a metal seed layer disposed on the corresponding one of the alternating N-type and P-type semiconductor regions 704 and 706.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, thermocompression bonding approaches for foil-based metallization of non-metal surfaces of solar cells, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a substrate;
   a plurality of alternating N-type and P-type semiconductor regions disposed above the substrate;

an anti-reflective coating layer disposed over the plurality of alternating N-type and P-type semiconductor regions;

a plurality of conductive contact structures over the plurality of alternating N-type and P-type semiconductor regions and over the anti-reflective coating layer, the plurality of conductive contact structures electrically connected to the plurality of alternating N-type and P-type semiconductor regions, each conductive contact structure comprising a metal foil portion, wherein the metal foil portion is an aluminum foil including aluminum and a texturized surface comprising a texture, wherein the texture of the metal foil portion is facing toward a corresponding one of the alternating N-type and P-type semiconductor regions, the texture having a nonplanar topography that provides a plurality of valleys between the plurality of conductive contact structures and the anti-reflective coating layer; and a metal flow region between the plurality of conductive contact structures and the anti-reflective coating layer, wherein the metal flow region fills in and at least partially closes ones of the plurality of valleys.

2. The solar cell of claim 1, wherein the plurality of alternating N-type and P-type semiconductor regions is a plurality of alternating N-type and P-type polycrystalline silicon regions disposed above the substrate.

3. The solar cell of claim 1, wherein portions of the anti-reflective coating layer are in direct contact with regions of the metal foil portions of the conductive contact structures.

4. The solar cell of claim 3, wherein the anti-reflective coating layer comprises a silicon-rich silicon nitride layer.

5. A solar cell, comprising:
a substrate;
a plurality of alternating N-type and P-type semiconductor regions disposed above the substrate;
an anti-reflective coating layer disposed over the plurality of alternating N-type and P-type semiconductor regions;
a plurality of conductive contact structures over the plurality of alternating N-type and P-type semiconductor regions and over the anti-reflective coating layer, the plurality of conductive contact structures electrically connected to the plurality of alternating N-type and P-type semiconductor regions, each conductive contact structure comprising a metal foil portion disposed above and in alignment with a corresponding one of the alternating N-type and P-type semiconductor regions, wherein the metal foil portion includes aluminum and has a texturized surface comprising a texture, and wherein the texture of the metal foil portion is facing toward the corresponding one of the alternating N-type and P-type semiconductor regions, the texture having a non-planar topography that provides a plurality of valleys between the plurality of conductive contact structures and the anti-reflective coating layer; and a metal flow region between the plurality of conductive contact structures and the anti-reflective coating layer, wherein the metal flow region fills in and at least partially closes ones of the plurality of valleys.

6. The solar cell of claim 5, wherein the plurality of alternating N-type and P-type semiconductor regions is a plurality of alternating N-type and P-type polycrystalline silicon regions disposed above the substrate.

7. The solar cell of claim 5, wherein portions of the anti-reflective coating layer are in direct contact with regions of the metal foil portions of the conductive contact structures.

8. The solar cell of claim 7, wherein the anti-reflective coating layer comprises a silicon-rich silicon nitride layer.

9. The solar cell of claim 1, wherein the texturized surface comprises a brushed foil texture in two directions.

10. The solar cell of claim 1, wherein the texturized surface comprises embossed portions.

11. The solar cell of claim 1, wherein the texturized surface comprises a surface oxide.

12. The solar cell of claim 5, wherein the texturized surface comprises a brushed foil texture in two directions.

13. The solar cell of claim 5, wherein the texturized surface comprises embossed portions.

14. The solar cell of claim 5, wherein the texturized surface comprises a surface oxide.

* * * * *